United States Patent
MacPherson et al.

(10) Patent No.: US 7,584,701 B2
(45) Date of Patent: Sep. 8, 2009

(54) PROCESSES FOR PRINTING LAYERS FOR ELECTRONIC DEVICES AND PRINTING APPARATUSES FOR PERFORMING THE PROCESSES

(75) Inventors: Charles Douglas MacPherson, Santa Barbara, CA (US); Dennis Damon Walker, Santa Barbara, CA (US); Matthew Stainer, Goleta, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 100 days.

(21) Appl. No.: 11/026,265

(22) Filed: Dec. 30, 2004

(65) Prior Publication Data

US 2006/0144277 A1 Jul. 6, 2006

(51) Int. Cl.
*B41L 35/14* (2006.01)
(52) U.S. Cl. .................................. 101/488; 101/487
(58) Field of Classification Search .............. 101/488, 101/487
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,247,190 A | 9/1993 | Friend et al. | |
| 5,317,169 A | 5/1994 | Nakano et al. | |
| 5,408,109 A | 4/1995 | Heeger et al. | |
| 6,001,515 A * | 12/1999 | Evans et al. | 430/7 |
| 6,440,877 B1 * | 8/2002 | Yamazaki et al. | 438/780 |
| 6,459,199 B1 | 10/2002 | Kido et al. | |
| 6,484,628 B2 * | 11/2002 | Otani et al. | 101/35 |
| 6,951,173 B1 * | 10/2005 | Meissl et al. | 101/483 |
| 2001/0019782 A1 | 9/2001 | Igarashi et al. | |
| 2002/0121638 A1 | 9/2002 | Grushin et al. | |
| 2003/0184613 A1 * | 10/2003 | Nakamura et al. | 347/40 |
| 2004/0119066 A1 | 6/2004 | Han et al. | |

FOREIGN PATENT DOCUMENTS

| | | |
|---|---|---|
| EP | 1 191 612 A2 | 3/2002 |
| EP | 1 191 614 A2 | 3/2002 |
| JP | 2002-75640 | 3/2002 |
| JP | 2004-55159 | 2/2004 |
| JP | 2004-74076 | 3/2004 |
| WO | WO 02/02714 A2 | 1/2002 |
| WO | WO 02/15645 A1 | 2/2002 |
| WO | WO 02/31896 A2 | 4/2002 |

\* cited by examiner

*Primary Examiner*—Anthony H. Nguyen
(74) *Attorney, Agent, or Firm*—John H. Lamming

(57) ABSTRACT

An electronic device includes a printed layer. In one embodiment, a process for forming the electronic device includes placing a workpiece over a chuck within a printing apparatus. A temperature difference is established between the workpiece and a liquid composition. The process further includes continuously printing the liquid composition over the workpiece. A viscosity of the liquid composition is allowed to increase at a rate significantly higher than an ambient viscosity increase rate. In another embodiment, the workpiece is allowed to cool to a temperature significantly below an ambient temperature before printing occurs. In still another embodiment, a printing apparatus is used for continuously printing the liquid composition over the workpiece. The printing apparatus includes the chuck, a printing head, a container, a feed line, and a first temperature-adjusting element thermally coupled to the chuck, the printing head, the container the feed line, or a combination thereof.

17 Claims, 6 Drawing Sheets

PROCESSES FOR PRINTING LAYERS FOR ELECTRONIC DEVICES AND PRINTING APPARATUSES FOR PERFORMING THE PROCESSES

BACKGROUND OF THE INVENTION

1. Field of the Invention

The invention relates generally to processes for forming electronic devices, and more specifically, to processes for printing layers for electronic devices and printing apparatuses for performing the processes.

2. Description of the Related Art

Electronic devices, including organic electronic devices, continue to be more extensively used in everyday life. Examples of organic electronic devices include Organic Light-Emitting Diodes ("OLEDs"). A variety of deposition techniques can be used in forming layers used in the OLED. Technique includes printing, such as ink-jet printing and continuous printing.

Ink-jet printing has been used extensively in the formation of full-color OLED displays due to its ability to dispense precise amounts of liquid. However, inkjet printers may not be capable of printing the narrowest of lines. Ink-jet printers dispense liquids as drops. A 40 pL drop can be used, but has a diameter of approximately 41 microns. Even when using state-of-the-art ink-jet technology, a 10 pL drop has a diameter of approximately 26 microns. In addition to having a limited ability to print fine lines, a printing head for an ink-jet printer moves at a rate no greater than approximately 0.1 m/s. A typical printing speed is approximately 0.064 m/s. As a result, ink-jet printing is time consuming, leading to limited throughput of devices.

Additionally, ink-jet printers are limited in their ability to print a wide variety of liquid compositions. For example, the solid concentration of a liquid composition is typically in a range of 0.5 to 1.5 weight percent, with viscosities between 5 and 15 centipoise within a printing head. At higher concentrations (e.g., viscosities at 15 centipoise and higher), the nozzle for the ink-jet printer has an increased likelihood of clogging or not flowing properly. At lower solids concentrations, too much volume needs to be dispensed resulting in poor line width control.

Continuous printing is just starting to become used in printing layers for electronic devices. Continuous printing can be performed using a printing head having a nozzle. The diameter of the nozzle can be in a range of approximately 10 to 50 microns. However, when a liquid composition is printed over a planar substrate at substantially ambient conditions (e.g., when the ambient temperature is 20° C.), the liquid composition can laterally spread to a width of 100 microns or more, as seen from a plan view of the substrate, before the viscosity of the liquid composition is high enough to restrict further lateral spreading.

SUMMARY OF THE INVENTION

An electronic device includes a layer that can be printed. In one embodiment, a process for forming the electronic device includes placing a workpiece over a chuck within a printing apparatus. The process also includes allowing a temperature difference to be established between the workpiece and a liquid composition, wherein the temperature difference is significantly different from zero. The process further includes continuously printing the liquid composition over the workpiece, wherein continuously printing is performed using the printing apparatus and after allowing the temperature difference to be established. The process still further includes allowing a viscosity of the liquid composition to increase at a rate significantly higher than an ambient viscosity increase rate, wherein allowing the viscosity of the liquid composition to increase is performed after continuously printing.

In another embodiment, a process for forming an electronic device includes placing a workpiece over a chuck within a printing apparatus and allowing the workpiece to cool to a temperature significantly below an ambient temperature. The process also includes printing a liquid composition over the workpiece, wherein the printing is performed using the printing apparatus after allowing the workpiece to cool.

In still another embodiment, a printing apparatus is used for continuously printing a liquid composition over a workpiece that includes at least part of an electronic device. The printing apparatus includes a chuck for holding the workpiece, a printing head for continuously printing the liquid composition over the workpiece, a container for holding the liquid composition, a feed line for transporting the liquid composition from the container to the printing head, and a first temperature adjusting element thermally coupled to the chuck, the printing head, the container the feed line, or a combination thereof.

The foregoing general description and the following detailed description are exemplary and explanatory only and are not restrictive of the invention, as defined in the appended claims.

BRIEF DESCRIPTION OF THE FIGURES

The invention is illustrated by way of example and not limitation in the accompanying figures.

Figure 1:
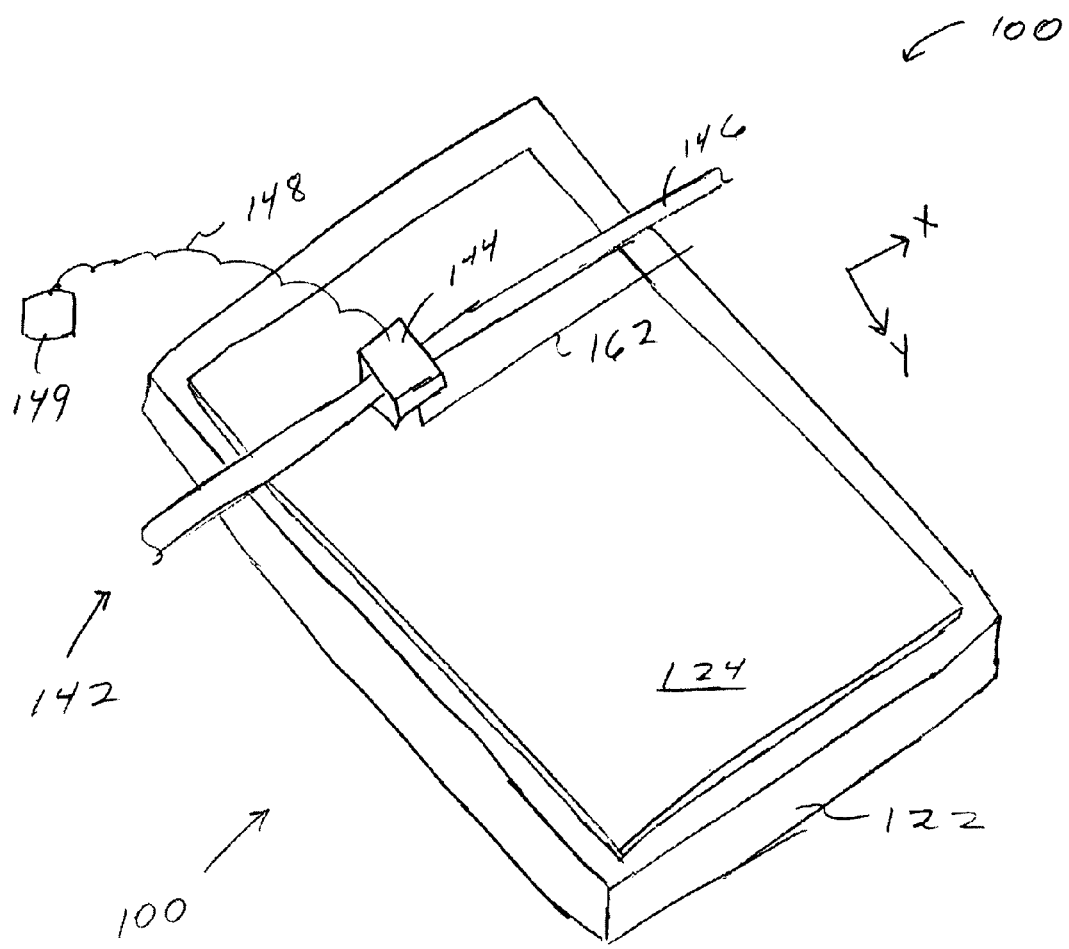
FIG. 1 includes an illustration of a perspective view of portion of a printing apparatus, including a printing assembly and chuck, while printing onto a workpiece.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device includes a layer that can be printed. In one embodiment, a process for forming the electronic device includes placing a workpiece over a chuck within a printing apparatus. The process also includes allowing a temperature difference to be established between the workpiece and a liquid composition, wherein the temperature difference is significantly different from zero. The process further includes continuously printing the liquid composition over the workpiece, wherein continuously printing is performed using the printing apparatus and after allowing the temperature difference to be established. The process still further includes allowing a viscosity of the liquid composition to increase at a rate significantly higher than an ambient viscosity increase rate, wherein allowing the viscosity of the liquid composition to increase is performed after continuously printing.

In another embodiment, the process further includes changing a temperature of the workpiece while the workpiece overlies the chuck, wherein changing the temperature is performed before continuously printing. In still another embodiment, the process further includes changing a temperature of the liquid composition, wherein changing the temperature is performed before continuously printing.

In yet another embodiment, the process further includes forming a first electrode over the workpiece before continuously printing. In a specific embodiment, the process further includes forming a substrate structure over the workpiece after forming the first electrode and before continuously printing. In another specific embodiment, the liquid composition forms an organic active layer over the first electrode. In a more specific embodiment, the process further includes forming a second electrode over the first electrode after continuously printing.

In one embodiment, a process for forming an electronic device includes placing a workpiece over a chuck within a printing apparatus and allowing the workpiece to cool to a temperature significantly below an ambient temperature. The process also includes printing a liquid composition over the workpiece, wherein the printing is performed using the printing apparatus after allowing the workpiece to cool.

In another embodiment, the process further includes forming a first electrode over the workpiece before printing. In a specific embodiment, the process further includes forming a substrate structure over the workpiece after forming the first electrode and before printing. In another specific embodiment, the liquid composition forms an organic active layer over the first electrode. In a more specific embodiment, the process further includes forming a second electrode over the first electrode after printing.

In one embodiment, a printing apparatus is used for continuously printing a liquid composition over a workpiece that includes at least part of an electronic device. The printing apparatus includes a chuck for holding the workpiece, a printing head for continuously printing the liquid composition over the workpiece, a container for holding the liquid composition, a feed line for transporting the liquid composition from the container to the printing head, and a first temperature adjusting element thermally coupled to the chuck, the printing head, the container the feed line, or a combination thereof.

In another embodiment, the first temperature-adjusting element includes a cooling line within the chuck. In still another embodiment, a cooling gas is directed towards the chuck. In yet another embodiment, the first temperature-adjusting element includes a heater within the chuck. In a further embodiment, the first temperature-adjusting element heats the printing head, the container the feed line, or a combination thereof. In still a further embodiment, the first temperature-adjusting element cools the printing head, the container the feed line, or a combination thereof.

In still other embodiments, an electronic device can be formed using any of the processes, fabricated using any of the printing apparatuses, or any combination thereof.

Other features and advantages of the invention will be apparent from the following detailed description, and from the claims. The detailed description first addresses Definitions and Clarification of Terms, followed by Printing Apparatus and Temperature Differential, Temperature Adjusting Element(s), Liquid Compositions, Segment Width and Viscosity, Printing and Temperatures During Printing, Electronic Device Fabrication, Alternative Embodiments, and Advantages.

1. Definitions and Clarification of Terms

Before addressing details of embodiments described below, some terms are defined or clarified. The term "active," when referring to a layer or material, is intended to mean a layer or material that exhibits electronic or electro-radiative properties. An active layer material may emit radiation or exhibit a change in concentration of electron-hole pairs when receiving radiation.

The term "ambient conditions" are intended to mean the conditions of a room in which humans are present. For example, the ambient conditions of a clean room within the microelectronics industry can include a temperature of approximately 20° C., relative humidity of approximately 40%, illumination using fluorescent light (with or without yellow filters), no sunlight (from outdoors), and laminar air flow.

The term "ambient temperature" is intended to mean a temperature of a room in which humans are present. For example, the ambient temperature of a clean room within the microelectronics industry is 20° C.

The term "ambient viscosity increase rate" is intended to mean a rate at which a viscosity of a liquid composition increases when exposed to ambient conditions.

The terms "array," "peripheral circuitry" and "remote circuitry" are intended to mean different areas or components of the organic electronic device. For example, an array may include pixels, cells, or other structures within an orderly arrangement (usually designated by columns and rows). The pixels, cells, or other structures within the array may be controlled locally by peripheral circuitry, which may lie within the same organic electronic device as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "buffer layer" or "buffer material" is intended to mean one or more electrically conductive or semiconductive materials and may have one or more functions in an electronic device, including planarization of the underlying layer, a charge-transport or charge-injecting property, scavenging of one or more impurities, such as oxygen or metal ions, or another aspect to facilitate or to improve the performance of the electronic device. A buffer material may be a polymer, a solution, a dispersion, a suspension, an emulsion, a colloidal mixture, another composition, or any combination thereof.

The term "charge-blocking," when referring to a layer, material, member, or structure, is intended to mean such layer, material, member or structure significantly reduces the likelihood that a charge intermixes with another layer, material, member or structure.

The term "charge-injecting," when referring to a layer, material, member, or structure, is intended to mean such layer, material, member or structure promotes charge migration into an adjacent layer, material, member or structure.

The term "charge-transport," when referring to a layer, material, member or structure, is intended to mean such layer, material, member or structure facilitates migration of such charge through the thickness of such layer, material, member or structure with relative efficiency and small loss of charge.

The term "chuck" is intended to mean a mechanism for supporting, holding, or retaining a substrate or a workpiece. The chuck may include one or more pieces. In one embodiment, the chuck may include a combination of a stage and an insert, a platform, another similar component, or any combination thereof.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the appropriate potential(s), performs a function. An electronic device may include or be part of a system. An example of an electronic device include a display, a sensor array, a computer system, an avionics system, an automobile, a cellular phone, another consumer or industrial electronic product, or the like.

The term "liquid composition" is intended to mean a material that is dissolved in a liquid medium to form a solution, dispersed in a liquid medium to form a dispersion, or suspended in a liquid medium to form a suspension or an emulsion.

The term "liquid medium" is intended to a liquid within a solution, dispersion, suspension, or emulsion. Liquid medium is used regardless whether one or more solvents are present, and therefore, liquid medium is used as the singular or plural form (liquid media) of the term.

The term "organic active layer" is intended to mean one or more organic layers, wherein at least one of the organic layers, by itself, or when in contact with a dissimilar material is capable of forming a rectifying junction.

The term "printing apparatus" is intended to mean a combination of one or more materials, equipment, system or subsystem, or any combination thereof designed for printing a layer over at least a portion of a substrate.

The term "precision deposition technique" is intended to mean a deposition technique that is capable of depositing one or more materials to a thickness no greater than approximately one millimeter. A stencil mask, frame, well structure, patterned layer or other structure(s) may be present during such deposition.

The term "printing head" is intended to mean a portion of a printing apparatus through which a liquid composition can be dispensed.

The term "rectifying junction" is intended to mean a junction within a semiconductor layer or a junction formed by an interface between a semiconductor layer and a dissimilar material, in which charge carriers of one type flow easier in one direction through the junction compared to the opposite direction. A pn junction is an example of a rectifying junction that can be used as a diode.

The term "substrate" is intended to mean a base material that can be either rigid or flexible and may include one or more layers of one or more materials, which can include glass, polymer, a metal or ceramic material, or any combination thereof. The reference point for a substrate is the beginning point of a process sequence. The substrate may or may not include electronic components, circuits, or conductive members.

The term "substrate structure" is intended to mean a structure overlying a substrate, wherein the structure serves a principal function of separating an area or region into smaller areas or regions. A substrate structure can include a cathode separator or a well structure.

The term "temperature adjusting element" is intended to mean one or more objects that are used to cool a different object, heat a different object, or maintain a different object at a substantially constant temperature. A temperature-adjusting element can include an evaporator, a combination of liquid or compressed gas and an expansion valve, a refrigeration unit, a heater, heating tape, a heating blanket, etc. One or more temperature sensors and a controller may be used with the temperature-adjusting element.

The term "thermal coupled" is intended to mean that a combination of one or more layers, one or more materials, one or more members, one or more structures, or any combination thereof contact each other or, if there are any intervening layer(s) material(s), member(s) or structure(s), all of such intervening layer(s), material(s), member(s) or structure(s) have low thermal resistance.

The term "workpiece" is intended to mean a substrate at any particular point of a process sequence. Note that the substrate may not significantly change during a process sequence, whereas the workpiece significantly changes during the process sequence. For example, at a beginning of a process sequence, the substrate and workpiece are the same. After a layer is formed over the substrate, the substrate has not changed, but now the workpiece includes the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Group numbers corresponding to columns within the Periodic Table of the elements use the "New Notation" convention as seen in the *CRC Handbook of Chemistry and Physics,* 81$^{st}$ Edition (2000).

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the organic light-emitting diode display, photodetector, photovoltaic, and semiconductor arts.

2. Printing Apparatus and Temperature Differential

A printing apparatus can be used to print a layer over nearly any substrate during the formation of an electronic device. FIG. 1 includes an illustration of a perspective view of a printing apparatus 100 and a workpiece 124 during a printing operation. The chuck 122 supports, holds, or retains the workpiece 124. The workpiece 124 can be held in place by clamps or pins, by one or more adhesive films, by vacuum, electrostatically, or any combination thereof. In one embodiment, the chuck 122 is configured to move in the y-direction as illustrated in FIG. 1. The printing apparatus 100 includes a printing assembly 142 including the printing head 144, an air bearing 146, and a nozzle (not illustrated). The printing head 144 may traverse the air bearing 146 in the x-direction as illustrated in FIG. 1. The printing apparatus 100 further includes a container 149 that is fluidly coupled to the printing head 144 via a feed line 148. The feed line 148 provides one or more liquids or liquid compositions from the container 149 to the printing head 144. In one embodiment, more than one feed line 148, more than one container 149, or any combination thereof can be connected to the printing head 144. Additional equipment may reside within or be used with the printing apparatus 100 but is not illustrated. Such other equipment can include any one or more stepper motors, pumps, filters, air handling equipment, control electronics, other electrical, mechanical, or electromechanical assemblies or subassemblies, facilities connections, or any combination thereof. A line 162 is printed on the workpiece 124 and a portion of the chuck 122 as illustrated in FIG. 1. The printing operation and options available during printing will be described later in this specification.

Many options are available for the movement of the chuck 122, the printing head 144, or both. The chuck 122 can move bi-directionally along one or more axes during printing. For example, the chuck 122 can move bi-directionally along the x-axis, y-axis, z-axis, or any combination thereof. The axis references are illustrated in FIG. 1. In one embodiment, each of the x-axis, y-axis, and z-axis is substantially perpendicular to the other two axes. The primary surface of the workpiece 124 is substantially parallel to a plane defined by the x-axis and y-axis. In one embodiment, the printing head 144, the chuck 122, or both are configured to allow motion along two different axes during continuously printing of a liquid composition. In one specific embodiment, printing the line 162 over the substrate is performed while the printing head moves at a rate in a range of 2 to 3 m/s.

The chuck 122 may also allow rotation about an axis or allow the workpiece 124 to be inclined, declined, or both compared to a reference plane, such as the floor of the room in which the printing apparatus 100 resides. The printing head 144 may or may not also move in any of those directions. When dispensing more than one liquid composition during a single printing action or when overlaying subsequent lines over the workpiece 124 during subsequent printing actions, the orientation of the nozzle, when printing, can affect the relative distance between the concurrently dispensed lines, the previously dispensed lines, or any combination thereof.

Note that the printing assembly 142 may be modified so that other equipment may be used in place of or in conjunction with the air bearing 146 to allow such motion. For example, the printing assembly 142 may include a gantry to allow motion along the x-axis and y-axis. In one embodiment, the workpiece 124 remains stationary during printing. One or both of the printing head 144 and the chuck 122 may move before, during, or after printing. In one embodiment, the printing head 144 and chuck 122 can be moved simultaneously. Nearly any movement of the chuck 122 or the printing head 144, or nearly any relative motion between the chuck 122 and the printing head 144 is possible.

Conventionally, electronic devices are designed in a rectilinear orientation. In one embodiment, the chuck 122 can be positioned to the correct x-direction position. The positioning can be performed using a conventional stepper motor. After the chuck 122 stops and upon supplying proper signal(s) to the printing apparatus 100, including the printing head 144, a line 162 is printed onto the workpiece 124. As will be described in more detail, a temperature difference can be created or maintained between a liquid composition, which is dispensed through the printing head 144, and the workpiece 124 such that the liquid composition has a viscosity that increases relatively quickly and keeps the width of the line being printed smaller than can otherwise be obtained without the temperature difference.

The nozzle for the printing head 144 can be an orifice with nearly any shape (e.g., circular, rectangular, etc.). For simplicity, the orifice is typically circular. In theory, the orifice may be nearly any size. Practical considerations may limit the size of the orifice. For example, the narrowest dimension to be printed may limit the size of the orifice. In one embodiment, the orifice has a width no greater than the narrowest dimension to be printed. In another embodiment, the orifice has a diameter in a range of approximately 5 to 30 microns, such as in a range of approximately 10 to 20 microns.

In another embodiment, the nozzle can be slot. A slot-shaped opening can be used for one or more layers that may be blanket deposited over a substrate or a portion thereof (e.g., an array for the electronic device). In one embodiment, the slot has a width in a range of approximately 5 to 30 microns and a length substantially the same dimension or longer than the corresponding dimension of the substrate or the portion thereof printed using the nozzle with the slot-shaped opening. Such an embodiment can be useful for depositing a buffer layer, a charge-blocking layer, a charge-injecting layer, a charge-transport layer, or a combination thereof.

During printing, the pressure within the printing head 144 can be in a range of approximately 100 to 350 KPa. The flow rate of liquid or a liquid composition from the printing head 144 can be in a range of 50 to 600 microliters per minute. In another embodiment, a higher or lower pressure, a higher or lower flow rate, or any combination thereof can also be used. After reading the specification, skilled artisans will be able to adjust or modify the printing apparatus 100 to achieve pressures and flow rates for their particular applications.

The printing head 144 can use a simpler design as compared to printing heads used for ink-jet printers. The simpler design allows a wider array of materials to be used within the printing head 144. For example, the printing head can use one or more plastic or polymer materials, such as polyetherketone, TEFLON® brand compound (E.I. DuPont de Nemours and Company) or other polyfluorocarbon compound, one or more metallic materials, such as stainless steel, copper, brass, MONEL™ brand (Cu—Ni) alloy, one or more ceramic materials, including glass, $Si_3N_4$, $Al_2O_3$, AlN, or any combination thereof. The printing head 144 does not require the use of corrosive nickel-containing components, epoxy, or both, which are found in conventional ink-jet printing heads. After reading this specification, skilled artisans will be able to determine which material(s) based on the liquid composition that will be dispensed. For example, with an organic active layer, a nickel-containing compound may be avoided.

Any one or more of the chuck 122, the printing head 144, the feed line 148, the container 149, other part(s) of the printing apparatus 100, or any combination thereof can include one or more temperature adjusting elements to raise the temperature, lower the temperature, or maintain the temperature of a local or larger area within the printing apparatus 100.

The ability to use different temperatures allows a wider range of materials, properties, or both to be used. In one embodiment, the viscosity of the liquid composition can be raised or lowered within the printing head 144, the feed line 148, the container 149 or other part(s) of the printing apparatus 100, the viscosity of the liquid composition can be raised or lowered at the workpiece 124 by adjust the temperature of the chuck 122, or any combination thereof. Additionally, boiling points for the liquid medium for the liquid composition can be outside the conventional limits seen with ink-jet printing. For example, cooling the liquid composition within the printing head 144, the feed line 148, the container 149, other part(s) of the printing apparatus 100 may allow a liquid medium to be used that would otherwise have too low of a boiling point. Alternatively, heating the liquid composition within the printing head 144, the feed line 148, the container 149, other part(s) of the printing apparatus 100 may allow a liquid medium to be used that would otherwise have too high of a viscosity if at an ambient temperature. Heating or cooling the chuck 122 can affect viscosity directly or indirectly (by changing the evaporation rate of the liquid medium of the liquid composition) to allow a wider variety of liquid compositions (including liquid medium) to be used.

In one embodiment, a temperature difference can be created or maintained between a liquid composition, which is dispensed through the printing head 144, and the workpiece 124. In one embodiment, the workpiece 124 is hotter than the liquid composition just before reaching the workpiece 124, or vice versa. In another embodiment, the temperature difference can be used to allow a viscosity of a liquid composition to increase quicker than under ambient conditions. In another embodiment, the temperature difference can allow the printed lines to dry more quickly, such that the liquid composition has a viscosity that increases relatively quickly and keeps the width of the line being printed smaller than can otherwise be obtained without the temperature difference. In still another embodiment, the temperature difference may allow the chuck to be relatively cooler than the liquid composition. In this embodiment, the vapor pressure from the printed segments can allow for a more uniform layer of vapor to reside above the printed segments and may allow for more uniform drying conditions between segments. In other embodiments, the temperature difference can be used for any one or more other reasons or for any combination of reasons.

Figure 2:
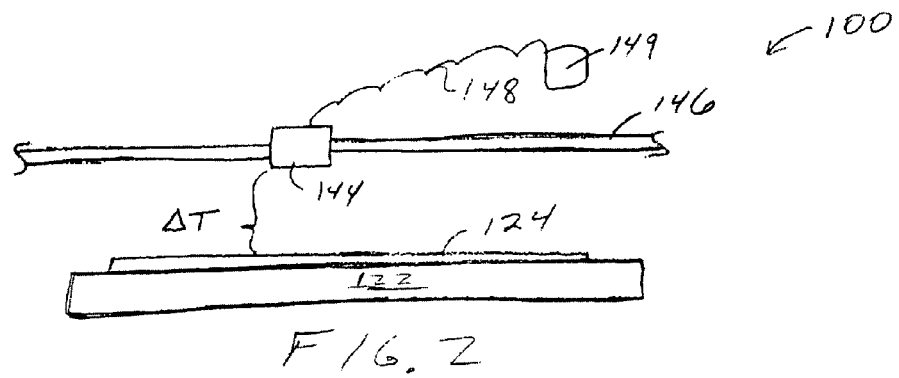
FIG. 2 includes an illustration of a side view of the printing apparatus and workpiece.

FIG. 2 includes an illustration of a side view of a portion of the printing apparatus 100. In one embodiment, the temperature difference ($\Delta AT$) can be achieved by having the liquid composition within the printing head 144, the feed line 148, the container 149, or a combination thereof at a temperature higher or lower with respect to the workpiece 124. In one embodiment, the temperature of the workpiece 124 can be controlled by controlling the temperature of the chuck 122. The actual temperature of the exposed surface of workpiece 124 can be approximated from the temperature of the chuck 122. In another embodiment, the temperature of the liquid composition just before reaching the workpiece 124 can be approximated using the temperature of the liquid composition within the printing head 144, the feed line 148, the container 149, or any combination thereof.

In one embodiment, the temperature of the workpiece 124 may be maintained at a lower temperature compared to the liquid composition when in the printing head 144. The relatively lower temperature increases the viscosity of the liquid medium within the liquid composition. Note that the liquid composition does not need to be converted to a gel or a solid in order for the lateral movement of the liquid composition to be constrained. In another embodiment, the cooler workpiece 124 can slow the evaporation rate of a liquid medium of a liquid composition printed onto the workpiece.

In another embodiment, the temperature of the workpiece 124 may be maintained at a higher temperature compared to the liquid composition when in the printing head 144. The relatively higher temperature allows liquid medium to evaporate at a higher rate thereby increasing the viscosity of a liquid composition because the amount of solids within the liquid composition remains substantially the same; however, the volume of the liquid medium is smaller. Again, the liquid composition does not need to be converted to a gel or a solid in order for the lateral movement of the liquid composition to be constrained.

In still other embodiments, the entire enclosed space may be taken to a temperature different from the ambient temperature. The space may be maintained at the desired temperature for the workpiece 124.

3. Temperature Adjusting Element(s)

Regardless of whether a temperature differential is to be established or if the space including the printing head 144, the workpiece 124, and the chuck 122 is to be maintained at a temperature substantially at or different from the ambient temperature, one or more temperature adjusting elements can be used.

The printing head 144, the feed line 148, the container 149, the chuck 122, or any combination thereof can include any one or more temperature adjusting elements. A temperature adjusting element can include a heater, heating tape, heating blanket, heated or cooled air or other fluid, heating or cooling channels, refrigeration unit, combination of a liquid or compressed gas and an expansion valve, or any combination thereof. In one embodiment, the chuck 122 includes a temperature-adjusting element, and the liquid composition within the printing head 144, the feed line 148, and the container 149 are maintained substantially at the ambient temperature. In another embodiment, the chuck 122 may be maintained substantially at the ambient temperature, and the printing head 144, the feed line 148, the container 149, or any combination thereof may include a temperature-adjusting element. In a further embodiment a temperature adjusting element may surround or direct a heated or cooled fluid at any one or more of the chuck 122, the printing head 144, the feed line 148, the container 149, or any combination thereof.

Figure 3:
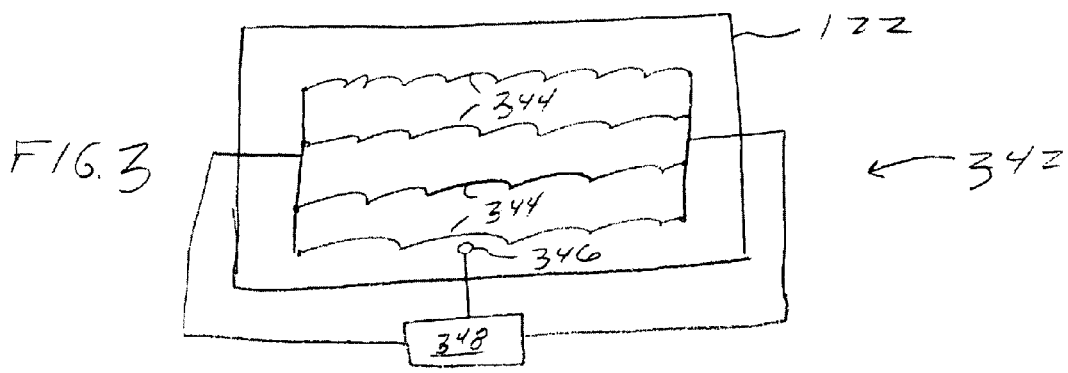
FIG. 3 includes an illustration of a cross-sectional view of the chuck used within the printing apparatus, wherein the chuck includes heating elements and a temperature sensor that are controlled by a temperature controller.
Figure 4:
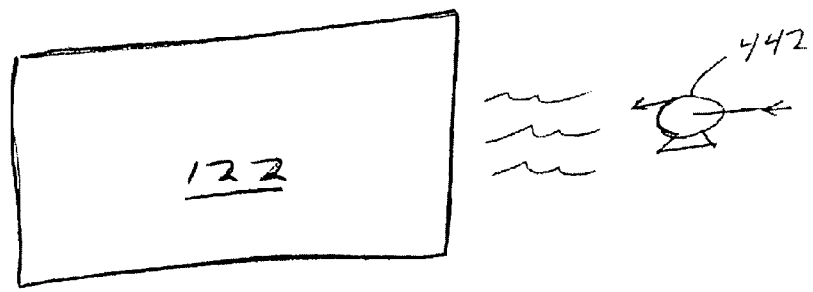
FIG. 4 includes an illustration including forced air or other gas being used to heat the chuck, cool the chuck, or maintain the chuck at a substantially constant temperature.
Figure 5:
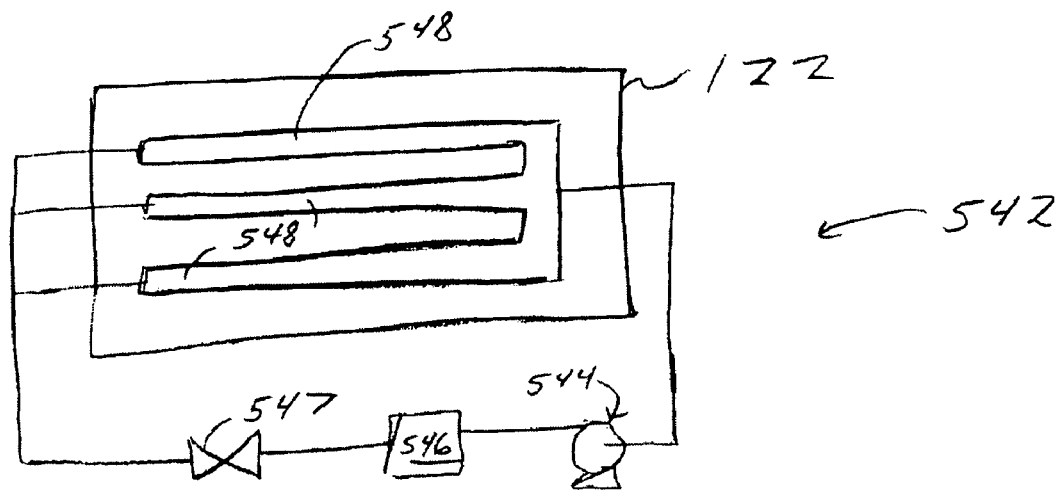
FIG. 5 includes an illustration of a chuck and a refrigeration unit thermally coupled to the chuck.

FIGS. 3 to 5 illustrate some exemplary, non-limiting embodiments of temperature adjusting elements and their configurations. FIG. 3 includes an illustration of the chuck 122 that includes a heating unit 342 that can be used with the chuck 122. The heating unit 342 includes a heater 344 within the chuck 122, a temperature sensor 346 that monitors the temperature of the chuck 122, and a controller 348. The controller 348 controls the heater 344 in response to the readings from the sensor 346. Each of the heater 344, the temperature sensor 346, and the controller 348 are conventional. After reading this specification, skilled artisans will appreciate that other designs for the heater 344 and more than one temperature sensor 346 can be used with the heating unit 342.

FIG. 4 includes an illustration of the chuck 122 in which a blower 442 directs air, nitrogen, another gas, or any combination thereof towards the chuck 122. The air, nitrogen, another gas, or any combination thereof may be heated or cooled before flowing through the blower 442, or the air, nitrogen, another gas, or any combination thereof may be heated or cooled after flowing through the blower 442 but before reaching the chuck 122. The air, nitrogen, another gas, or any combination thereof may be directed towards the workpiece 124 and chuck 122 or may be directed to the opposite side (backside) of the chuck 122.

As an alternative to heating, cooling may be used. FIG. 5 includes an illustration of a refrigeration unit 542 that can be at least partially incorporated within the chuck 122. A conventional, commercially-available refrigerant may be received by a compressor 544, which compresses the refrigerant and sends the compressed refrigerant to a condenser 546. The condenser 546 can reduce the temperature of the compressed refrigerant. The refrigerant can then flow through an expansion valve 547 where the refrigerant is allowed to expand and cool. The expanded and cooled refrigerant can pass through cooling channels 548 within the chuck 122. In an alternative embodiment, the expansion valve 547 may be omitted and the refrigerant can expand within the cooling channels 548. In another embodiment (not illustrated), a liquid or compressed gas may replace the compressor 544 and condenser 546. In this embodiment, the liquid or compressed gas may pass through the expansion valve 547 and through the cooling channels 548. The effluent from the cooling channels 548 can be vented to atmosphere or sent to a scrubber or other chemical recovery unit.

After reading this specification, skilled artisans will appreciate that there are many other ways of heating or cooling the chuck 122. Additionally, skilled artisans will understand how to modify the embodiments described with respect to the chuck 122 so that similar embodiments for the printing head 144, the feed line 148, the container 149, or any combination thereof can be used and not depart from the scope of the present invention. Therefore, the embodiments described herein should be viewed as illustrative and not limiting.

The spacing between the printing head 144 and the workpiece can be adjusted to a greater extent compared to ink-jet printers. For example, in an ink-jet printer, the spacing between the printing head and the surface of the workpiece 124 is typically in a range of approximately 300 to 500 microns.

The printing apparatus 100 can be adjusted to allow a much greater range in distance between the workpiece 124 and the printing head 144. While an actual upper limit is unknown, in one embodiment, the distance between the workpiece 124 and the printing head 144 does not exceed approximately 2.0 mm. At distances greater than approximately 2 mm, the liquid stream coming from the nozzle 145 may start to diverge before reaching the workpiece 124. When working with small dimensions (e.g., no greater than 50 microns), such divergence may be unacceptable. In still other embodiments, other distances may be used, such as at least 11 microns, or no greater than 0.9 mm. After reading this specification, skilled artisans will appreciate that many other distances between the printing head 144 and the workpiece 124 can be used and tailored to specific applications and dimensions of electronic components within or on the workpiece 124.

The printing apparatus 100 can include a showerhead to provide an inert gas during printing. The inert gas can include $N_2$, $CO_2$, He, Ne, Ar, Kr, Xe, or any combination thereof. The inert gas can be used to reduce the likelihood that oxygen, water, or other environmental contaminant will adversely interact or react with a layer printed onto the workpiece 124. The inert gas can also increase the evaporation rate of the liquid medium within the liquid composition after being printed onto the workpiece 124. The inert gas may or may not be warmer or cooler than the ambient temperature when it reaches the exposed surface of the workpiece 124. A conventional heating or cooling apparatus (not illustrated) can be used to heat, cool, or maintain the temperature of the inert gas as it reaches the workpiece 124. In one embodiment, the inert gas has a temperature in a range of approximately 5 to 80° C. when it reaches the workpiece 124.

4. Liquid Compositions

The printing apparatus 100 can be used to deposit a variety of different materials, including liquid compositions. The following paragraphs include only some but not all of the materials that may be used. In one embodiment, one or more materials for an organic or inorganic layer within an electronic device are formed using the printing apparatus 100.

The printing apparatus 100 is well suited for printing liquid compositions. The printing apparatus 100 allows a wider range of operating parameters and liquid compositions to be used compared to a conventional ink-jet printer. In one embodiment, one or more parameters can affect the flow characteristics of the liquid composition. Viscosity is a parameter that can affect the flow characteristics. The viscosity can be affected by selection of the liquid medium, the solids content within the liquid medium, temperature of the liquid composition, or potentially one or more other factors, or any combination thereof. Viscosity can be affected directly by temperature (viscosity of the liquid medium increases with decreasing temperature or decreases with increasing temperature) or indirectly by changing the evaporation rate of the liquid medium within the liquid composition (i.e., using liquid medium having lower or higher boiling points, changing the temperature of the liquid composition, or a combination thereof. After reading this specification, skilled artisans will appreciate that they have many different ways to allow a significantly larger selection of liquid medium, a larger range of solids concentration of the liquid composition to be used, or a combination thereof.

The liquid composition can be in the form of a solution, dispersion, emulsion, or suspension. In the paragraphs that follow, non-limiting examples of solid materials and liquid medium are given. The solid material(s) can be selected upon the electronic or electro-radiative properties for a subsequently-formed layer. The liquid medium can be selected based on criteria described later in this specification.

When using the printing apparatus 100, the liquid composition may have solid(s) greater than approximately 2.0 weight percent without having to worry about clogging. In one embodiment, the solid(s) content is in a range of approximately 2.0 to 3.0 weight percent. Further, the printing apparatus 100 does not require precisely formed drops to be used. Therefore, the printing apparatus 100 can use a liquid composition having a higher viscosity or lower boiling point compared to a conventional ink-jet printer. Further, the printing apparatus 100 can use a liquid composition having a lower viscosity or higher boiling point compared to a conventional ink-jet printer. Additionally, the liquid medium within a liquid composition does not need to be degassed before printing. For example, a conventional ink-jet printer used for dispensing a conductive organic material within an aqueous solution requires the aqueous solvent to be degassed. However, because printing apparatus 100 allows for more processing margin, degassing of a liquid medium is not required for the proper operation of the printing apparatus 100.

An organic layer printed using the printing apparatus 100 can include an organic active layer, (e.g., a radiation-emitting organic active layer or a radiation-responsive organic active layer), filter layer, buffer layer, charge-injecting layer, charge-transport layer, charge-blocking layer, or any combination thereof. The organic layer may be used as part of a resistor, transistor, capacitor, diode, etc.

For a radiation-emitting organic active layer, suitable radiation-emitting materials include one or more small molecule materials, one or more polymeric materials, or a combination thereof. A small molecule material may include any one or more of those described in, for example, U.S. Pat. No. 4,356,429 ("Tang"); U.S. Pat. No. 4,539,507 ("Van Slyke"); U.S. Patent Application Publication No. US 2002/0121638 ("Grushin"); or U.S. Pat. No. 6,459,199 ("Kido"). Alternatively, a polymeric material may include any one or more of those described in U.S. Pat. No. 5,247,190 ("Friend"); U.S. Pat. No. 5,408,109 ("Heeger"); or U.S. Pat. No. 5,317,169 ("Nakano"). An exemplary material is a semiconducting conjugated polymer. An example of such a polymer includes poly(paraphenylenevinylene) (PPV), a PPV copolymer, a polyfluorene, a polyphenylene, a polyacetylene, a polyalkylthiophene, poly(n-vinylcarbazole) (PVK), or the like. In one specific embodiment, a radiation-emitting active layer without any guest material may emit blue light.

For a radiation-responsive organic active layer, a suitable radiation-responsive material may include many a conjugated polymer or an electroluminescent material. Such a material includes, for example, a conjugated polymer or an electro- and photo-luminescent material. A specific example includes poly(2-methoxy, 5-(2-ethyl-hexyloxy)-1,4-phenylene vinylene) ("MEH-PPV") or a MEH-PPV composite with CN-PPV.

The location of a filter layer may be between an organic active layer and a user side of the electronic device. A filter layer may be part of a substrate, an electrode (e.g., an anode or a cathode), a charge-transport layer, a charge-injecting layer, a charge-blocking layer; the filter layer may lie between any one or more of the substrate, an electrode, charge-a transport layer, a charge-injecting layer, a charge-blocking layer, or any combination thereof; or any combination thereof. In another embodiment, the filter layer may be a layer that is fabricated separately (while not attached to the substrate) and later attached to the substrate at any time before, during, or after fabricating the electronic components within the electronic device. In this embodiment, the filter layer may lie between the substrate and a user of the electronic device.

When the filter layer is separate from or part of the substrate, or when the filter lies between the substrate and an electrode closest to the substrate, a suitable material includes an organic material including a polyolefin (e.g., polyethylene or polypropylene); a polyester (e.g., polyethylene terephthalate or polyethylene naphthalate); a polyimide; a polyamide; a polyacrylonitrile or a polymethacrylonitrile; a perfluorinated or partially fluorinated polymer (e.g., polytetrafluoroethylene or a copolymer of tetrafluoroethylene and polystyrene); a polycarbonate; a polyvinyl chloride; a polyurethane; a polyacrylic resin, including a homopolymer or a copolymer of an ester of an acrylic or methacrylic acid; an epoxy resin; a Novolac resin; or any combination thereof.

For a hole-injecting layer, hole-transport layer, electron-blocking layer, or any combination thereof, a suitable material includes polyaniline ("PANI"), poly(3,4-ethylenedioxythiophene) ("PEDOT"), polypyrrole, an organic charge transfer compound, such as tetrathiafulvalene tetracyanoquinodimethane ("TTF-TCQN"), a hole-transport material as described in Kido, or any combination thereof.

For an electron-injecting layer, electron transport layer, hole-blocking layer, or any combination thereof, a suitable material includes a metal-chelated oxinoid compound (e.g., $Alq_3$ or aluminum(III)bis(2-methyl-8-quinolinato)-4-phenylphenolate ("Balq")); a phenanthroline-based compound (e.g., 2,9-dimethyl-4,7-diphenyl-1,10-phenanthroline ("DDPA") or 9,10-diphenylanthracene ("DPA")); an azole compound (e.g., 2-tert-butylphenyl-5-biphenyl-1,3,4-oxadiazole ("PBD") or 3-(4-biphenyl)-4-phenyl-5-(4-t-butylphenyl)-1,2,4-triazole ("TAZ"); an electron transport material as described in Kido; a diphenylanthracene derivative; a dinaphthylanthracene derivative; 4,4-bis(2,2-diphenyl-ethen-1-yl)-biphenyl ("DPVBI"); 9,10-di-beta-naphthylanthracene; 9,10-di-(naphenthyl)anthracene; 9,10-di-(2-naphthyl)anthracene ("ADN"); 4,4'-bis(carbazol-9-yl) biphenyl ("CBP"); 9,10-bis-[4-(2,2-diphenylvinyl)-phenyl]-anthracene ("BDPVPA"); anthracene, N-arylbenzimidazoles (such as "TPBI"); 1,4-bis[2-(9-ethyl-3-carbazoyl)vinylenyl] benzene; 4,4'-bis[2-(9-ethyl-3-carbazoyl)vinylenyl]-1,1'-biphenyl; 9,10-bis[2,2-(9,9-fluorenylene)vinylenyl]anthracene; 1,4-bis[2,2-(9,9-fluorenylene)vinylenyl]benzene; 4,4'-bis[2,2-(9,9-fluorenylene)vinylenyl]-1,1'-biphenyl; perylene, substituted perylenes; tetra-tert-butylperylene ("TBPe"); bis(3,5-difluoro-2-(2-pyridyl)phenyl-(2-carboxypyridyl) iridium III ("F(Ir)Pic"); a pyrene, a substituted pyrene; a styrylamine; a fluorinated phenylene; oxidazole; 1,8-naphthalimide; a polyquinoline; one or more carbon nanotubes within PPV; or any combination thereof.

For an electronic component, such as a resistor, transistor, capacitor, etc., the organic layer may include one or more of thiophenes (e.g., polythiophene, poly(alkylthiophene), alkylthiophene, bis(dithienthiophene), alkylanthradithiophene, etc.), polyacetylene, pentacene, phthalocyanine, or any combination thereof.

An example of an organic dye includes 4-dicyanmethylene-2-methyl-6-(p-dimethylaminostyryl)-4H-pyran (DCM), coumarin, pyrene, perylene, rubrene, a derivative thereof, or any combination thereof.

An example of an organometallic material includes a functionalized polymer comprising one or more functional groups coordinated to at least one metal. An exemplary functional group contemplated for use includes a carboxylic acid, a carboxylic acid salt, a sulfonic acid group, a sulfonic acid salt, a group having an OH moiety, an amine, an imine, a diimine, an N-oxide, a phosphine, a phosphine oxide, a β-dicarbonyl group, or any combination thereof. An exemplary metal contemplated for use includes a lanthanide metal (e.g., Eu, Tb), a Group 7 metal (e.g., Re), a Group 8 metal (e.g., Ru, Os), a Group 9 metal (e.g., Rh, Ir), a Group 10 metal (e.g., Pd, Pt), a Group 11 metal (e.g., Au), a Group 12 metal (e.g., Zn), a Group 13 metal (e.g., Al), or any combination thereof. Such an organometallic material includes a metal chelated oxinoid compound, such as tris(8-hydroxyquinolato)aluminum ($Alq_3$); a cyclometalated iridium or platinum electroluminescent compound, such as a complex of iridium with phenylpyridine, phenylquinoline, or phenylpyrimidine ligands as disclosed in published PCT Application WO 02/02714, an organometallic complex described in, for example, published applications US 2001/0019782, EP 1191612, WO 02/15645, WO 02/31896, and EP 1191614; or any mixture thereof.

An example of a conjugated polymer includes a poly(phenylenevinylene), a polyfluorene, a poly(spirobifluorene), a copolymer thereof, or any combination thereof.

Selecting a liquid medium can also be an important factor for achieving one or more proper characteristics of the liquid composition. A factor to be considered when choosing a liquid medium includes, for example, viscosity of the resulting solution, emulsion, suspension, or dispersion, molecular weight of a polymeric material, solids loading, type of liquid medium, boiling point of the liquid medium, temperature of an underlying substrate, thickness of an organic layer that receives a guest material, or any combination thereof In some embodiments, the liquid medium includes at least one solvent. An exemplary organic solvent includes a halogenated solvent, a colloidal-forming polymeric acid, a hydrocarbon solvent, an aromatic hydrocarbon solvent, an ether solvent, a cyclic ether solvent, an alcohol solvent, a glycol solvent, a ketone solvent, a nitrile solvent, a sulfoxide solvent, an amide solvent, or any combination thereof.

An exemplary halogenated solvent includes carbon tetrachloride, methylene chloride, chloroform, tetrachloroethylene, chlorobenzene, bis(2-chloroethyl) ether, chloromethyl ethyl ether, chloromethyl methyl ether, 2-chloroethyl ethyl ether, 2-chloroethyl propyl ether, 2-chloroethyl methyl ether, or any combination thereof.

An exemplary colloidal-forming polymeric acid includes a fluorinated sulfonic acid (e.g., fluorinated alkylsulfonic acid, such as perfluorinated ethylenesulfonic acid) or any combinations thereof.

An exemplary hydrocarbon solvent includes pentane, hexane, cyclohexane, heptane, octane, decahydronaphthalene, a petroleum ether, ligroine, or any combination thereof.

An exemplary aromatic hydrocarbon solvent includes benzene, naphthalene, toluene, xylene, ethyl benzene, cumene (iso-propyl benzene) mesitylene (trimethyl benzene), ethyl toluene, butyl benzene, cymene (iso-propyl toluene), diethylbenzene, iso-butyl benzene, tetramethyl benzene, sec-butyl benzene, tert-butyl benzene, anisole, 4-methylanisole, 3,4-dimethylanisole, or any combination thereof.

An exemplary ether solvent includes diethyl ether, ethyl propyl ether, dipropyl ether, diisopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, or any combination thereof.

An exemplary cyclic ether solvent includes tetrahydrofuran, dioxane, tetrahydropyran, 4 methyl-1,3-dioxane, 4-phenyl-1,3-dioxane, 1,3-dioxolane, 2-methyl-1,3-dioxolane, 1,4-dioxane, 1,3-dioxane, 2,5-dimethoxytetrahydrofuran, 2,5-dimethoxy-2,5-dihydrofuran, or any combination thereof.

An exemplary alcohol solvent includes methanol, ethanol, 1-propanol, 2-propanol, 1-butanol, 2-butanol, 2-methyl-1-propanol (i.e., iso-butanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, or any combination thereof.

An alcohol ether solvent may also be employed. An exemplary alcohol ether solvent includes 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, or any combination thereof.

An exemplary glycol solvent includes ethylene glycol, propylene glycol, propylene glycol monomethyl ether (PGME), dipropylene glycol monomethyl ether (DPGME), or any combination thereof.

An exemplary ketone solvent includes acetone, methylethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, or any combination thereof.

An exemplary nitrile solvent includes acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, or any combination thereof.

An exemplary sulfoxide solvent includes dimethyl sulfoxide, di-n-butyl sulfoxide, tetramethylene sulfoxide, methyl phenyl sulfoxide, or any combinations thereof.

An exemplary amide solvent includes dimethyl formamide, dimethyl acetamide, acylamide, 2-acetamidoethanol, N,N-dimethyl-m-toluamide, trifluoroacetamide, N,N-dimethylacetamide, N,N-diethyldodecanamide, epsilon-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, or any combinations thereof.

A crown ether contemplated includes any one or more crown ethers that can function to assist in the reduction of the chloride content of an epoxy compound starting material as part of the combination being treated according to the invention. An exemplary crown ether includes benzo-15-crown-5; benzo-18-crown-6; 12-crown-4; 15-crown-5; 18-crown-6; cyclohexano-15-crown-5; 4',4"(5")-ditert-butyldibenzo-18- crown-6; 4',4"(5")-ditert-butyldicyclohexano-18-crown-6; dicyclohexano-18-crown-6; dicyclohexano-24-crown-8; 4'-aminobenzo-15-crown-5; 4'-aminobenzo-18-crown-6; 2-(aminomethyl)-15-crown-5; 2-(aminomethyl)-18-crown-6; 4'-amino-5'-nitrobenzo-15-crown-5; 1-aza-12-crown-4; 1-aza-15-crown-5; 1-aza-18-crown-6; benzo-12-crown-4; benzo-15-crown-5; benzo-18-crown-6; bis((benzo-15-crown-5)-15-ylmethyl)pimelate; 4-bromobenzo-18-crown-6; (+)-(18-crown-6)-2,3,11,12-tetra-carboxylic acid; dibenzo-18-crown-6; dibenzo-24-crown-8; dibenzo-30-crown-10; ar-ar'-di-tert-butyidibenzo-18-crown-6; 4'-formylbenzo-15-crown-5; 2-(hydroxymethyl)-12-crown-4; 2-(hydroxymethyl)-15-crown-5; 2-(hydroxymethyl)-18-crown-6; 4'-nitrobenzo-15-crown-5; poly-[(dibenzo-18-crown-6)-co-formaldehyde]; 1,1-dimethylsila-11-crown-4; 1,1-dimethylsila-14-crown-5; 1,1-dimethylsila-17-crown-5; cyclam; 1,4,10,13-tetrathia-7,16-diazacyclooctadecane; porphines; or any combination thereof.

In another embodiment, the liquid medium includes water. A conductive polymer complexed with a water-insoluble colloid-forming polymeric acid can be deposited over a substrate and used as a charge-transport layer.

Many different classes of liquid medium (e.g., halogenated solvents, hydrocarbon solvents, aromatic hydrocarbon solvents, water, etc.) are described above. Mixtures of more than one of the liquid medium from different classes may also be used.

The liquid composition may also include an inert material, such as a binder material, a filler material, or a combination thereof. With respect to the liquid composition, an inert material does not significantly affect the electronic, radiation emitting, or radiation responding properties of a layer that is formed by or receives at least a portion of the liquid composition.

5. Segment Width and Viscosity

The width of a segment to be printed onto the workpiece 124 can be controlled by increasing the viscosity of a liquid composition after it reaches the workpiece 124 in order to constrain the flow of the liquid composition in one or more lateral directions as seen from a plan view of the workpiece 124. The viscosity of the liquid composition would normally increase when exposed to ambient conditions as a liquid medium within the liquid composition evaporates. However, the rate at which the viscosity increases under ambient conditions may be too low, particularly when a high-resolution display is to be formed.

The viscosity of nearly all liquids decreases with an increase in temperature and increases with a decrease in temperature. The vapor pressure of nearly all materials in a liquid state increases with an increase in temperature and decreases with a decrease in temperature. As will be described in more detail, the viscosity of a liquid composition can be increased directly by reducing the temperature of the liquid composition or indirectly by increasing the temperature of the liquid composition such that a substantially constant amount of solids resides within a smaller volume of a liquid medium due to an increased evaporation rate. The relative evaporation rates between different liquids can be determined by boiling points or vapor pressures. For example, a lower boiling point material has a higher evaporation rate as compared to a higher boiling point material. Similarly a higher vapor pressure material (at a specific temperature) has a higher evaporation rate as compared to a lower vapor pressure material (at the same specific temperature).

In one embodiment, the rate at which the viscosity of a liquid composition changes can be achieved by maintaining a temperature difference between the liquid composition being printed onto the workpiece 124 and the workpiece 124, itself. In a specific embodiment, the liquid composition, the workpiece 124, or both are not substantially at the ambient temperature. The temperature of the workpiece 124 can be changed by heating or cooling the chuck 122, and the temperature of the liquid composition can be changed by heating or cooling the liquid composition within the printing head 144, the feed line 148, the container 149, or any combination thereof.

6. Printing and Temperatures During Printing

Figure 6:
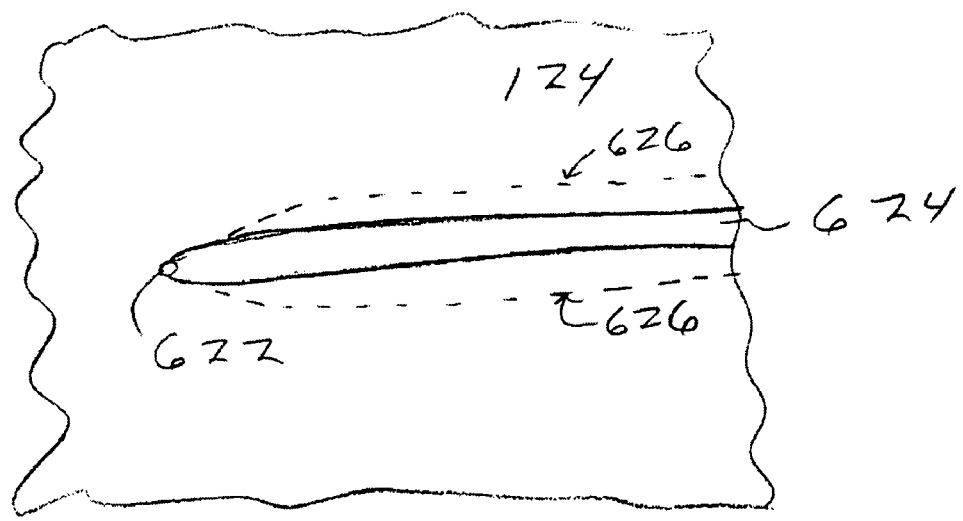
FIG. 6 includes an illustration of a plan view of the substrate during continuous printing to illustrate better line width control as compared to a conventional method.

In one embodiment, the printing apparatus 100 can be used to print a liquid composition as a segment onto the workpiece 124. The width of the segment may be controlled by using any one or more of the temperature adjusting elements previously described to achieve the temperature difference as illustrated in FIG. 2 as previously described. FIG. 6 includes an illustration of a plan view of a workpiece 124 during and shortly after continuously printing a liquid composition over at least a portion of the workpiece 124 using one or more of the embodiments described herein. The dimension of the nozzle 145 can be in a range of approximately 10 to 20 microns wide. In one embodiment, the nozzle 145 is approximately 18 microns wide. The liquid composition reaches the workpiece 124 in a stream 622, which is illustrated by a circle in FIG. 6. The liquid reaches the workpiece 124 as the printing head 144 (not illustrated in FIG. 6) moves to the left. The liquid composition begins to laterally spread and forms segment 624 in FIG. 6. The temperature difference allows the viscosity to increase faster than the ambient viscosity increase rate. If the liquid composition would be printed under ambient conditions (liquid composition and workpiece 124 both substantially at the ambient temperature) the printed line would have a shape corresponding to the dashed lines 626. Although not meant to limit, the width of segment 624 is in a range of approximately 40 to 60 microns, and the width of the dashed lines (distance between dashed lines 626) can easily exceed 100 microns.

When forming high resolution, small geometry patterns, the width, as illustrated by dashed lines 626, may be unacceptable, and thus cause a material within the liquid composition to intermix with portion(s) of the workpiece 124 in which such material is not intended or desired. For example, if a red light-emitting material is part of a liquid composition, its introduction into a region of a workpiece 124 in which a blue or green light-emitting component has been or will be formed may affect the wavelength of the emission maximum for that blue or green light-emitting component. A similar concept may hold for radiation-sensing components that are to respond to radiation at different wavelengths or spectra of wavelengths.

The temperature(s) used for the liquid composition and workpiece 124 are determined more by practical considerations than by theoretical limits. Temperature considerations for the workpiece 124 and the liquid composition are described in more detail below. The actual temperatures selected may depend upon a number of considerations. These considerations may or may not depend on the material(s), liquid medium, or a combination thereof within the liquid composition. After reading this specification, skilled artisans will be able to choose temperatures for the chuck 122, workpiece 124, printing head 144, feed line 148, container 149, or any combination thereof to meet the needs or desires for the particular application selected.

The selection of the temperature(s) may be limited by ambient conditions. For example, a clean room may be maintained at a temperature of approximately 20° C. and 40% relative humidity. At these conditions, the dew point is about 5° C. Therefore, the temperature of the chuck 122, workpiece 124, or both may be maintained at a temperature greater than 5° C. to reduce the likelihood of water condensing on the chuck 122, workpiece 124, or both. In another embodiment, the atmosphere within the printing apparatus 100 can be changed so that the printing is performed in an atmosphere that is different from the ambient atmosphere outside of the printing apparatus 100. For example, air or another gas with substantially less water vapor may allow the temperature of the chuck 122, the workpiece 124, or both to be taken to a temperature of 5° C. or lower. If the workpiece 124, the printing head 144, the feed line 148, the container 149, or any combination thereof is cooled below the ambient temperature (e.g., 20° C.), a liquid medium with a boiling point no greater than 150° C. can be used.

One or more layers or electronic components already residing on or within the workpiece 124 may determine a lower or an upper limit for the temperature of the chuck 122, the workpiece 124, or both. For example, if the workpiece 124 is taken below 0° C., any residual water on or within any part of the workpiece 124 may become frozen and damage layer(s) or portions of component(s), including the layer(s) formed over the substrate of workpiece 124 during or after printing. On the other end of the spectrum, the temperature of the workpiece 124 or the chuck 122 should not be so high as to damage layer(s) or portions of component(s) on or within the workpiece 124 or the layer(s) formed on the workpiece 124 during printing. As used in this specification, damage includes significantly reducing the lifetime of an electronic component, including any material(s) or layer(s) therein, as compared to printing at substantially ambient conditions.

Regarding the liquid composition, the limits of its temperature exposure can depend upon material(s) and liquid medium of the liquid composition. The lower and upper temperature limits of the solid material(s) within the liquid composition are similar to limits for the layer(s) and material(s) on or within the workpiece 124. For example, if the workpiece 124 includes an organic active layer or the liquid composition is used to form an organic active layer, such organic active layer or liquid composition would not be exposed to a temperature of 80° C. for a prolonged time. Otherwise, the lifetime of electronic components formed from the liquid composition may be significantly reduced.

The liquid medium may have temperature limits determined more by viscosity and vapor pressure considerations. For lower temperatures, the viscosity of the liquid medium may not be so low as to substantially adversely affect the flow of the liquid composition at the printing head 144. As the molecular weight(s) of component(s) within the liquid medium decrease, the temperature of the liquid medium may be reduced without significantly adversely affecting the flow of the liquid composition within the printing head 144. For higher temperatures, the temperature of the liquid medium may not be so high that the liquid medium boils, flashes, or has an unacceptably high vapor pressure. As the molecular weight(s) of component(s) within the liquid medium increase, the temperature of the liquid medium may be increased without significantly adversely affecting the flow of the liquid composition within the printing head 144.

In one embodiment, the temperature used for the liquid composition, the workpiece 124, the chuck 122, the printing head 144, the feed line 148, and the container 149 is limited by a plurality of considerations. For example, the printing operation may be performed in a clean room, and therefore, the workpiece 124 and the chuck 122 may be maintained at a temperature higher than 5° C. Also, the liquid composition may be used to form an organic active layer, or the workpiece 124 may already include an organic active layer at the time of printing. In this embodiment, the organic active layer is not exposed to a temperature greater than approximately 80° C. for a prolonged time. Therefore, the maximum temperature difference ($\Delta T$ in FIG. 2) for this specific embodiment is 75° C. After reading this specification, skilled artisans will consider the temperature limitations of the liquid compositions, the layer(s) or the component(s) present on the workpiece 124 during printing, and other limitations of the printing apparatus 100 in order to select proper temperatures for a specific application.

In another embodiment, a process for forming an electronic device comprises placing the workpiece 124 over the chuck 122 within the printing apparatus 100. The process can further include allowing a temperature difference to be established between the workpiece 124 and the liquid composition before reaching the substrate. The temperature difference is significantly different from zero. The method can also include printing the liquid composition over the workpiece 124 and allowing a viscosity of the liquid composition to increase at a rate significantly higher than an ambient viscosity increase rate. In one embodiment, heating may be used. In another embodiment, cooling can be used.

7. Electronic Device Fabrication

Figure 7:
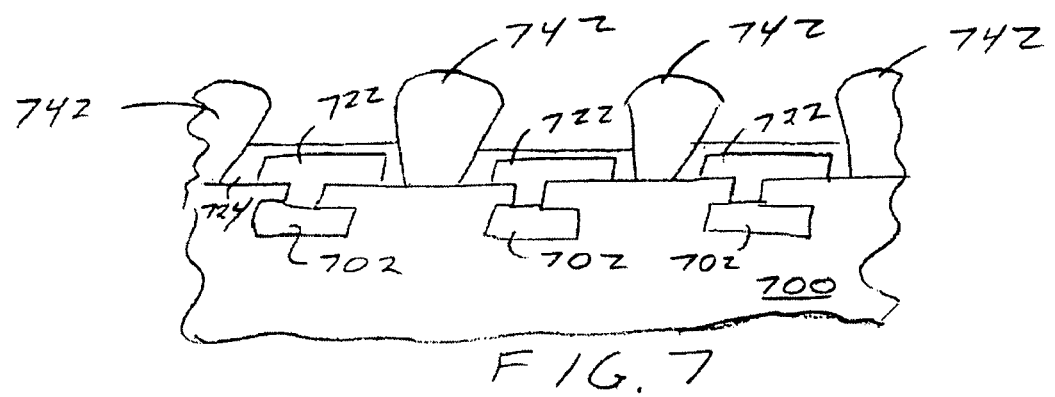
FIGS. 7 to 11 include illustrations of cross-sectional views of a portion of a workpiece during a fabrication sequence for the electronic device, wherein at least one layer within the electronic device is formed using the printing apparatus described herein.

FIGS. 7 to 11 include illustrations of cross-sectional views of a portion of a workpiece during a fabrication sequence for the electronic device, wherein at least one layer within the electronic device is formed using the printing apparatus 100. FIG. 7 includes an illustration of a cross-sectional view of a portion of a substrate 700. The substrate 700 is conventional, can include an organic or inorganic material, and may be rigid or flexible. The substrate 700 includes pixel driving circuits 702 within the substrate 700 and openings in which first electrodes 722 are connected thereto. In one embodiment, the first electrodes 722 are anodes for electronic components being formed. The first electrodes 722 can be formed by depositing a patterned layer or by blanket depositing a layer and subsequently patterning it. The methods for deposition and optional patterning are conventional.

In one embodiment, substrate structures 742 are formed between the first electrodes 722. In one embodiment, the substrate structures 742 include well structures that define the locations where an organic layer is subsequently formed. In a specific embodiment, the substrate structures 742 include an inorganic (e.g., silicon dioxide, silicon nitride, aluminum oxide, aluminum nitride, etc.) or organic material (e.g., photoresist, polyimide, etc.), or any combination thereof. In another embodiment, the substrate structures 742 can include a black material (e.g., carbon) in order to increase contrast to ambient light while the device is being operated.

In the particular electronic device being formed, an organic layer is then formed. In one embodiment, the organic layer includes an organic active layer. A buffer layer, a charge-injecting layer, charge-transport layer, charge-blocking layer, or a combination thereof may be formed before or after the organic active layer. Materials for these layers have been previously described. Referring to FIG. 7, a hole-transport layer 724, which is a type of a charge-transport layer, is formed over the first electrodes 722. In one embodiment, the hole-transport layer 724 is deposited using a conventional technique. After forming the hole-transport layer 724, the workpiece includes the substrate 700, pixel driving circuits 702, first electrodes 722, the hole-transport layer 724, and the substrate structures 742.

Figure 8:
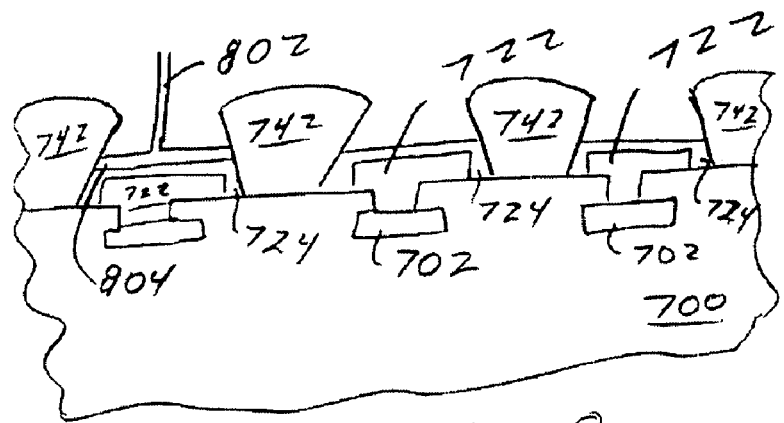

An organic active layer is formed over the hole-transport layer 724. In one embodiment, the printing apparatus 100 is used in forming one or more organic active layers from one or more liquid compositions. A first liquid composition, illustrated as column 802 in FIG. 8, is continuously printed onto the workpiece between a pair of substrate structures 742. The first liquid composition is initially printed as a liquid layer 804 between the pair of substrate structures 742. In one embodiment, the temperature of the first liquid composition is approximately 20° C., the temperature of the chuck 122 is in a range of approximately 5 to 80° C., and the workpiece 124 is within 2° C. of the temperature of the chuck 122. In one embodiment, the first liquid composition has a viscosity in a range of approximately 4 to 6 centipoise before reaching the workpiece. The viscosity of the first liquid composition doubles within a second after contacting the workpiece, and more specifically, the viscosity is in a range of approximately 14 to 16 centipoise in a time period of approximately 50 ms. At this point in the process, the first organic active layer 924 is formed as illustrated in FIG. 9.

Figure 9:
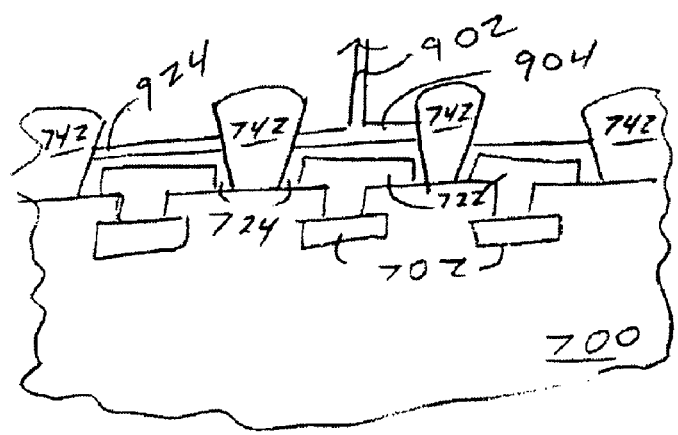

FIG. 9 also illustrates a second liquid composition, illustrated as column 902, that is continuously printed onto the workpiece to form a liquid layer 904. In one embodiment, the second liquid composition has a different solid material compared to the first liquid composition but has the same liquid medium as the first liquid composition. In one embodiment, the temperature of the second liquid composition is approximately 20° C., the temperature of the chuck 122 is in a range of approximately 5 to 80° C., and the workpiece 124 is within 2° C. of the temperature of the chuck 122. In one embodiment, the second liquid composition has a viscosity in a range of approximately 4 to 6 centipoise before reaching the workpiece. Similar to the first liquid composition, the viscosity of the second liquid composition doubles within a second after contacting the workpiece, and more specifically, the viscosity is in a range of approximately 14 to 16 centipoise in a time period of approximately 50 ms. At this point in time, the second organic active layer 1024 is formed as illustrated in FIG. 10.

Figure 10:
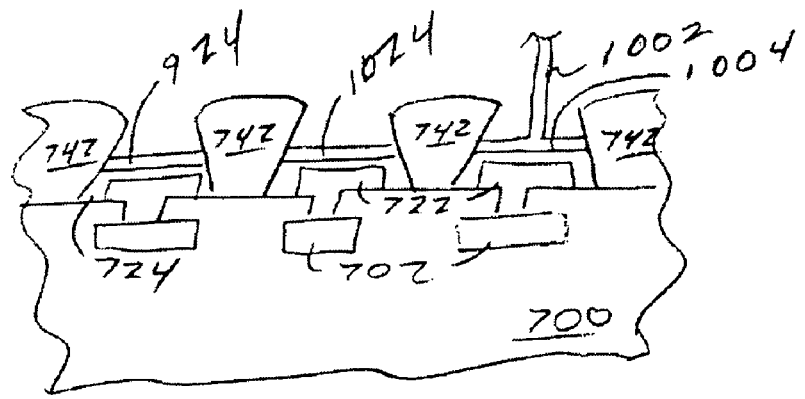

FIG. 10 also illustrates a third liquid composition, illustrated as column 1002, that is continuously printed onto the workpiece to form a liquid layer 1004. In one embodiment, the third liquid composition has a different solid material compared to the first and second liquid compositions but has the same liquid medium as the first and second liquid compositions. In one embodiment, the temperature of the third liquid composition is approximately 20° C., the temperature of the chuck 122 is in a range of approximately 5 to 80° C., and the workpiece 124 is within 2° C. of the temperature of the chuck 122. In one embodiment, the third liquid composition has a viscosity in a range of approximately 4 to 6 centipoise before reaching the workpiece. Similar to the first liquid composition, the viscosity of the third liquid composition doubles within a second after contacting the workpiece, and more specifically, the viscosity is in a range of approximately 14 to 16 centipoise in a time period of approximately 50 ms. At this point in time, the third organic active layer 1124 is formed as illustrated in FIG. 11.

An optional curing operation may be performed to remove substantially all of the liquid medium remaining within the first, second, or third organic layers 924, 1024, and 1124, respectively. The curing may be performed after printing each of the organic active layers or may be performed only after all of the first, second, and third organic active layers 924, 1024, and 1124 are formed. The curing is performed using a conventional technique.

Figure 11:
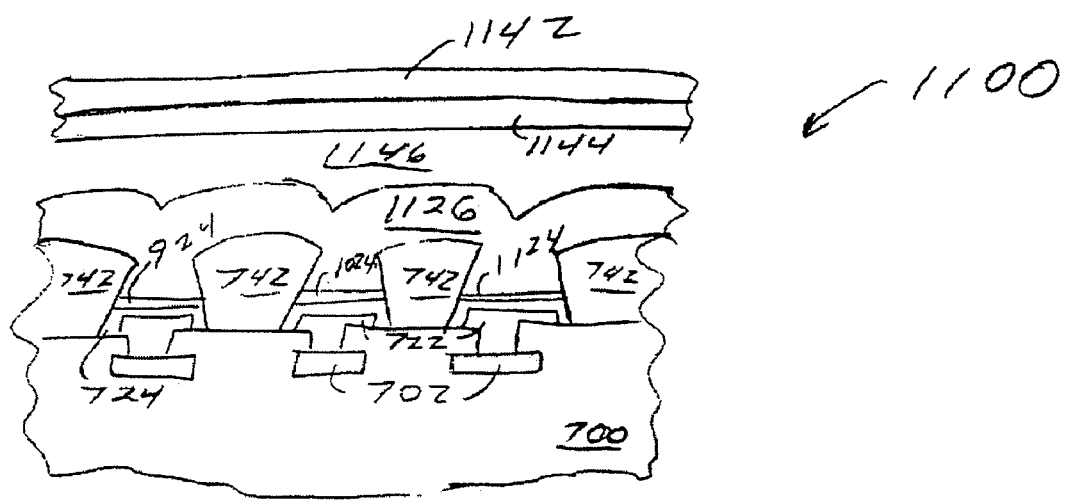

Processing continues to form a substantially completed electronic device 1100 as illustrated in FIG. 11. Note that the first, second, and third organic active layers 924, 1024, and 1124 may have the same or different compositions. Therefore, electronic components including the first, second, and third organic active layers 924, 1024, and 1124 may emit or respond to radiation at the same or different wavelengths. A second electrode 1126 is formed over the substrate structures 742 and the first, second, and third organic active layers 924, 1024, and 1124. In one embodiment, the second electrode is a common cathode for the electronic device 100. Subsequent processing is performed that attaches a lid 1142 including a desiccant 1144 to the substrate 700 at locations not shown in FIG. 11 but outside the array. A gap 1146 may be formed between the lid 1142 and the second electrode 1126.

8. Alternative Embodiments

Other electronic devices may be formed in a similar manner. For example, the concepts described herein may be used to form passive matrix displays, active matrix displays, sensor arrays, or photovoltaic cells. In addition to concepts may be extended in the formation of other electronic components in which a layer is printed and lateral spreading of that printed layer is a concern. In another embodiment the substrate structures 742 may not be needed or desired. In still another embodiment the substrate structures 742 or substrate 700 may or may not be fluorinated or otherwise treated to make a surface hydrophobic.

The embodiments described herein can be extended to other types of printing, including printing using drops, such as an inkjet, or for other discontinuous types of printing. The pattern for the printing may be linear, in more than one direction, or may even include curved lines or sharp bends, as seen from a plan view of the substrate. The heating, cooling, or a combination of the two can be implemented relatively easily within a printing apparatus and, in one embodiment, does not increase the process complexity of printing onto the substrate.

9. Advantages

The printing processes described herein can be used to form layers in the shape of lines that are narrower than printing using conventional methods. A temperature difference can be made that helps to increase the viscosity faster after it contacts a workpiece than would be obtained if the printing is performed using ambient conditions. Smaller line width allows higher resolution displays or sensor arrays, higher electronic component density, or a combination thereof.

The use of the temperature adjusting elements can also increase the variety of liquid medium that can be used within the liquid compositions. In one embodiment, heating the liquid composition before printing may allow a liquid medium having higher viscosities compared to a conventional liquid medium used in ink jet printers to be used.

The modifications to existing equipment and processes are relatively straightforward. Integration of the processes into an existing process flow does not require radical changes to process flows.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. A process for forming an electronic device comprising:
   placing a workpiece over a chuck within a printing apparatus;
   activating a temperature adjusting element within the printing apparatus;
   establishing the workpiece at a first temperature;
   forming a first electrode, a second electrode, and a third electrode over a substrate before continuously printing a first liquid composition, wherein said first liquid composition includes a red light-emitting material and is subsequently printed over the first electrode;
   establishing the first liquid composition at a second temperature, wherein at least a 5° C. difference exists between the first temperature and the second temperature;
   continuously printing the first liquid composition over the workpiece, wherein continuously printing is performed using the printing apparatus;
   allowing a viscosity of the first liquid composition to increase by at least 4 centipoise within one second of contacting the workpiece;
   continuously printing a second liquid composition over the workpiece, wherein continuously printing the second liquid composition is performed using the printing apparatus and after allowing the at least 5° C. temperature difference to be established, wherein the second liquid composition includes a green light-emitting material;
   allowing a viscosity of the second liquid composition to increase by at least 4 centipoise within one second of contacting the workpiece, wherein allowing the viscosity of the second liquid composition to increase is performed after continuously printing;
   continuously printing a third liquid composition over the workpiece, wherein continuously printing the third liquid composition is performed using the printing apparatus and after allowing the at least 5° C. temperature difference to be established, wherein the third liquid composition includes a blue light-emitting material; and
   allowing a viscosity of the third liquid composition to increase by at least 4 centipoise within one second of contacting the workpiece, wherein allowing the viscosity of the third liquid composition to increase is performed after continuously printing.

2. The process of claim 1, wherein activating a temperature adjusting element raises the first temperature.

3. The process of claim 1, further comprising changing a temperature of the first liquid composition, wherein changing the temperature is performed before continuously printing.

4. The process of claim 1, further comprising forming a first electrode over the workpiece before continuously printing.

5. The process of claim 4, further comprising forming a substrate structure over the workpiece after forming the first electrode and before continuously printing.

6. The process of claim 4, further comprising curing an organic layer formed from the first liquid composition, the curing occurring after continuously printing, and forming a second electrode over the organic layer.

7. An electronic device formed by the process of claim 4.

8. A process for forming an electronic device comprising:
   placing a workpiece over a chuck within a printing apparatus;
   allowing the workpiece to cool to at least 50° C. below an ambient temperature;
   forming a first electrode, a second electrode, and a third electrode over a substrate before continuously printing a first liquid composition, wherein said first liquid composition includes a red light-emitting material and is subsequently printed over the first electrode;
   printing the first liquid composition over the workpiece, wherein the printing is performed using the printing apparatus after allowing the workpiece to cool;
   continuously printing a second liquid composition over the workpiece, wherein continuously printing the second liquid composition is performed using the printing apparatus and after allowing the workpiece to cool, wherein the second liquid composition includes a green light-emitting material;
   allowing a viscosity of the second liquid composition to increase by at least 4 centipoise within one second of contacting the workpiece, wherein allowing the viscosity of the second liquid composition to increase is performed after continuously printing;
   continuously printing a third liquid composition over the workpiece, wherein continuously printing the third liquid composition is performed using the printing apparatus and after allowing the workpiece to cool, wherein the third liquid composition includes a blue light-emitting material; and
   allowing a viscosity of the third liquid composition to increase by at least 4 centipoise within one second of contacting the workpiece, wherein allowing the viscosity of the third liquid composition to increase is performed after continuously printing.

9. The process of claim 8, further comprising forming a first electrode over the workpiece before printing.

10. The process of claim 9, further comprising forming a substrate structure over the workpiece after forming the first electrode and before printing.

11. The process of claim 9, wherein the liquid composition forms an organic active layer over the first electrode.

12. The process of claim 11, further comprising curing the organic layer, the curing occurring after continuously printing, and forming a second electrode over the organic layer.

13. An electronic device formed by the process of claim 11.

14. The process of claim 1, wherein the first electrode, the second electrode, and the third electrode are different electrodes.

15. The process of claim 1, wherein allowing a temperature difference to be established between the workpiece and a first liquid composition comprises heating the chuck of the printing apparatus.

16. The process of claim 1, wherein continuously printing is performed such that the liquid composition is dispensed from a printing head after placing the workpiece over the chuck and before reaching an edge of the workpiece.

17. The process of claim 8, wherein printing is performed such that the liquid composition is dispensed from a printing head after placing the workpiece over the chuck and before reaching an edge of the workpiece.

* * * * *